United States Patent [19]
Drake

[11] 3,945,715
[45] Mar. 23, 1976

[54] ELECTRO-OPTICAL BIREFRINGENCE DEVICE EMPLOYING EDGE EFFECT

[75] Inventor: Marvin D. Drake, Palm Bay, Fla.
[73] Assignee: Harris-Intertype Corporation, Cleveland, Ohio
[22] Filed: Apr. 15, 1974
[21] Appl. No.: 460,741

[52] U.S. Cl................................. 350/150; 350/157
[51] Int. Cl.²............................................ G02F 1/03
[58] Field of Search..................................... 350/150

[56] References Cited
UNITED STATES PATENTS

| | | |
|---|---|---|
| 2,928,075 | 3/1960 | Anderson........................ 350/150 X |
| 3,499,704 | 3/1970 | Land et al....................... 350/150 X |
| 3,623,031 | 11/1971 | Kumada........................ 350/150 UX |

*Primary Examiner*—John K. Corbin

[57] ABSTRACT

An electro-optical transducer and data storage device is operated by electrically establishing different electric field levels in a retentive ferroelectric PLZT crystal. The crystal may have a plurality of areas that serve as data storage elements, each of which is defined by crossover areas of rows and columns of transparent electrodes that are on opposite sides of the crystal, each storage element being spaced away from other storage elements of the crystal by surrounding edge regions. When a data storage element is retentively polarized by the application and removal of a voltage pulse to opposite electrodes, the portion of the crystal between the electrodes contracts transversely, establishing a strain gradient in the edge regions surrounding the data storage element. This localized strain gradient, together with a fringing electric field in the edge regions, causes a high level of birefringence there, and permits the edge regions to serve as amplitude modulators of polarized light. When light is applied on a path through a polarizer, through the crystal, and through a cross-polarized analyzer, the output of the analyzer has light from edge regions of elements which have not been polarized. The apparatus can serve as an electro-optical transducer and memory for large blocks of data, for example.

4 Claims, 12 Drawing Figures

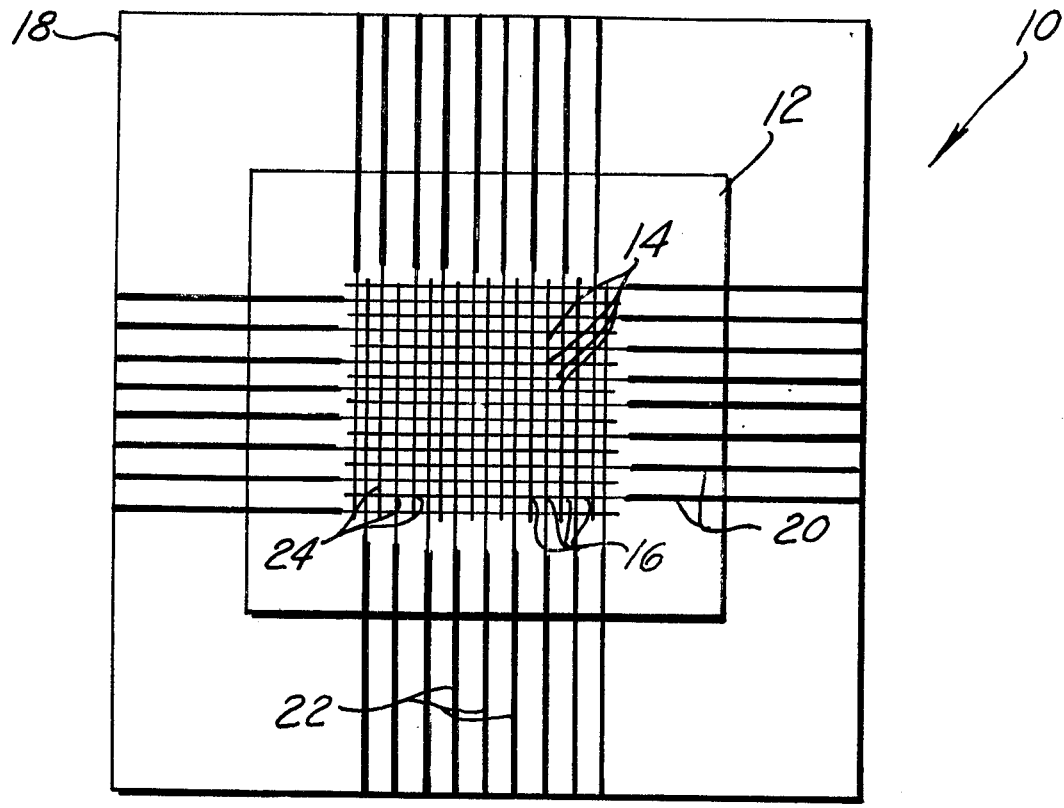
FIG. 1
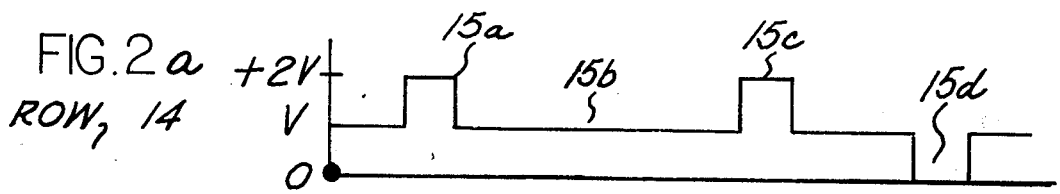
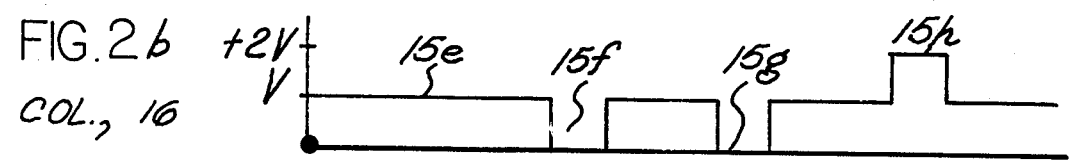
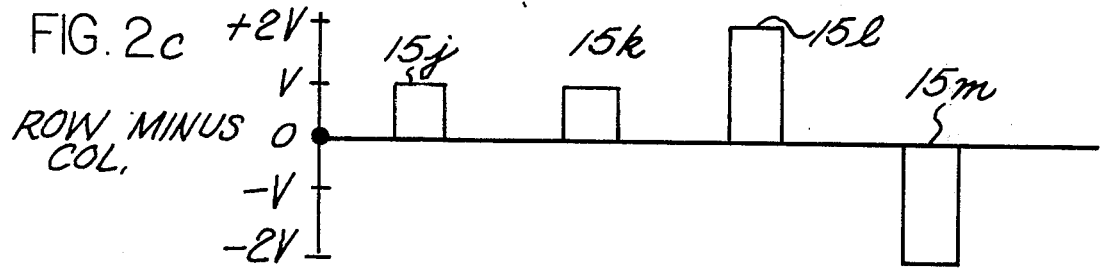

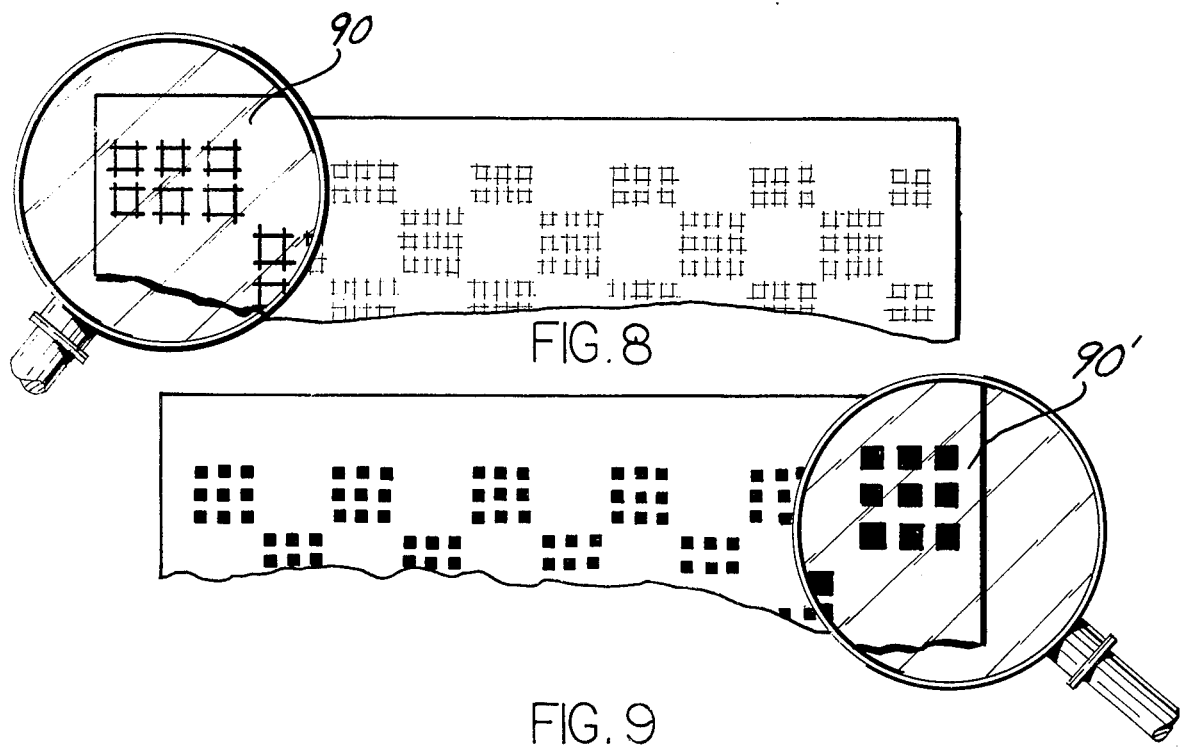
FIG. 8
FIG. 9
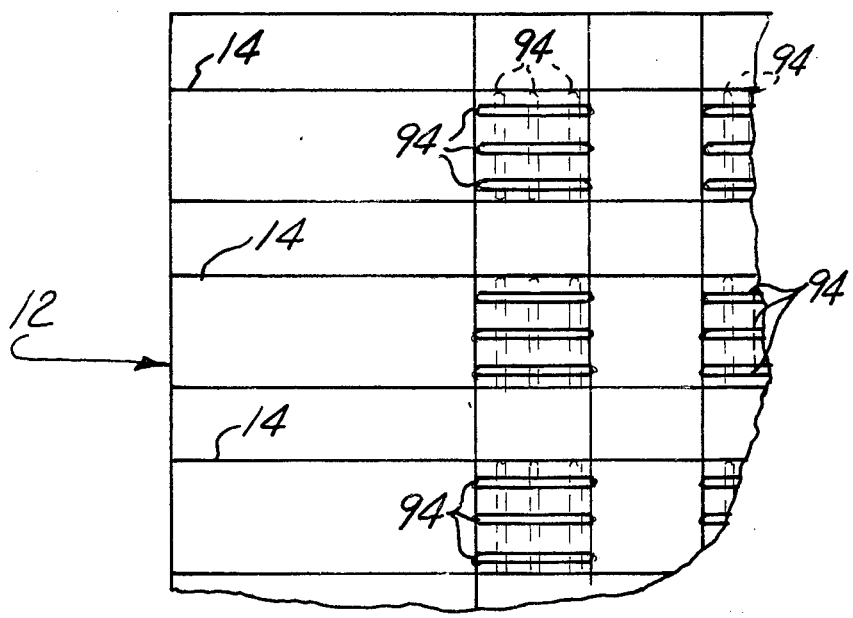
FIG. 10

ELECTRO-OPTICAL BIREFRINGENCE DEVICE EMPLOYING EDGE EFFECT

BACKGROUND OF THE INVENTION

Coherent optical systems involving lasers are capable of rapidly manipulating great blocks of data at high data rates. Such coherent data systems can perform mathematical operations, data reduction, pattern recognition, and other operations on two-dimensional blocks of data. Devices for converting electrical data signals to two-dimensional coherent optical data arrays are useful as input devices to coherent optical data systems. Some of these devices, referred to herein as block data composers, have both transducing capability and memory capability. Matrix-type block data composers of PLZT crystals have been employed in the prior art in strain biased modes of operation and in scattering modes in which light passing through the crystal is scattered into different sizes of solid angles at the output.

In some of the strain-biased electro-optical storage devices of the prior art, birefringent properties of PLZT crystal have been employed. To enhance the birefringence phenomenon, a mechanical strain bias has been produced in the crystal by bonding the crystal to a transparent plastic plate that is much thicker than the crystal, and bending the plate in a holding jig to subject the crystal to tension along an axis parallel to its major surfaces. This technique, while satisfactory for strain biasing a single crystal memory element or a small array of elements on a single crystal, is troublesome when employed to strain bias a large matrix of data storage locations on a single crystal. Variations in the strain applied to different areal portions of the crystal result in greatly different birefringence effects at the different portions, and inhomogeneities and differences in thickness of the crystal from place to place on its relatively large surface necessitate different amounts of strain bias which cannot be provided simultaneously by the bending jig.

SUMMARY OF THE INVENTION

The present invention is a method and apparatus for converting an electrical signal to an optical signal in which the electrical signal is applied as an electric field to a first portion of a crystal that is capable of birefringent properties. The electric field induces a strain gradient at an edge region between the first portion of the crystal having the electric field and another portion which has no electric field. A beam of light having a polarization characteristic is passed through the crystal parallel to the electric field, and the polarization characteristic of the light is or is not altered in the edge region in dependence upon whether or not an electric field exists in the first portion. The invention therefore employs a birefringent effect that is strongly present at the edges of an elemental data storage area.

In a specific embodiment, a plurality of elemental data storage areas are formed on a PLZT crystal by depositing transparent electrodes on the surfaces of the crystal. A data bit is stored in a data element by applying voltage between opposing electrodes to remanently store an electric polarization field in the ferroelectric crystal. The polarization produces a strain gradient at the edges of the element, which, together with the polarizing electric field, induces a birefringent effect at those edges. Presence or absence of the birefringence is determined by an optical technique; that is, the data status of the element is read optically. No external mechanical strain bias is required.

Accordingly, one aspect of the present invention is a data element, or a plurality of data elements forming a block data composer, for electrical write-in, storage, and non-destructive optical readout, and having a relatively high contrast ratio upon readout, without the necessity for mechanically strain biasing the data element or the block data composer.

Another aspect is a data element or a matrix-type block data composer that employs an edge effect mode for producing birefringent effects at the edges of the storage element or elements of the device.

Another aspect is a self-strain-biased crystal storage element that can be used in relatively large arrays of data storage elements on a single crystal.

Another aspect is a block data composer employing an edge effect, and in which a high light fill factor within each matrix element area is achieved by providing a plurality of electrode edges within each element area.

Still another aspect is a block data composer employing an edge effect and in which a high fill factor is achieved by optically reading at a plane of defocus spaced away from an image plane.

A further aspect is a switching method for polarizing and depolarizing the elements of a ferroelectric storage matrix so as to exhibit great resistance of the zero state to half-select signals.

LIST OF DRAWINGS

Other objects and features of the invention will be apparent from the written description which follows, and the drawings, in which:

FIG. 1 is a plan view of a matrix of data elements forming a block data composer according to a preferred embodiment of the invention;

FIGS. 2a, 2b, and 2c show various voltages applied to electrodes of the block data composer of FIG. 1;

FIG. 8 depicts an image of a portion of a PLZT matrix-type block data composer operated in the edge effect mode, as observed at a focal plane;

FIG. 9 shows an image of a portion of the block data composer when observed either slightly inside the focal plane or with segmented electrodes, to produce a better light fill factor;

FIG. 10 illustrates segmented electrodes for increasing the constrast ratio of a block data composer.

DESCRIPTION OF A PREFERRED EMBODIMENT

Figure 3:
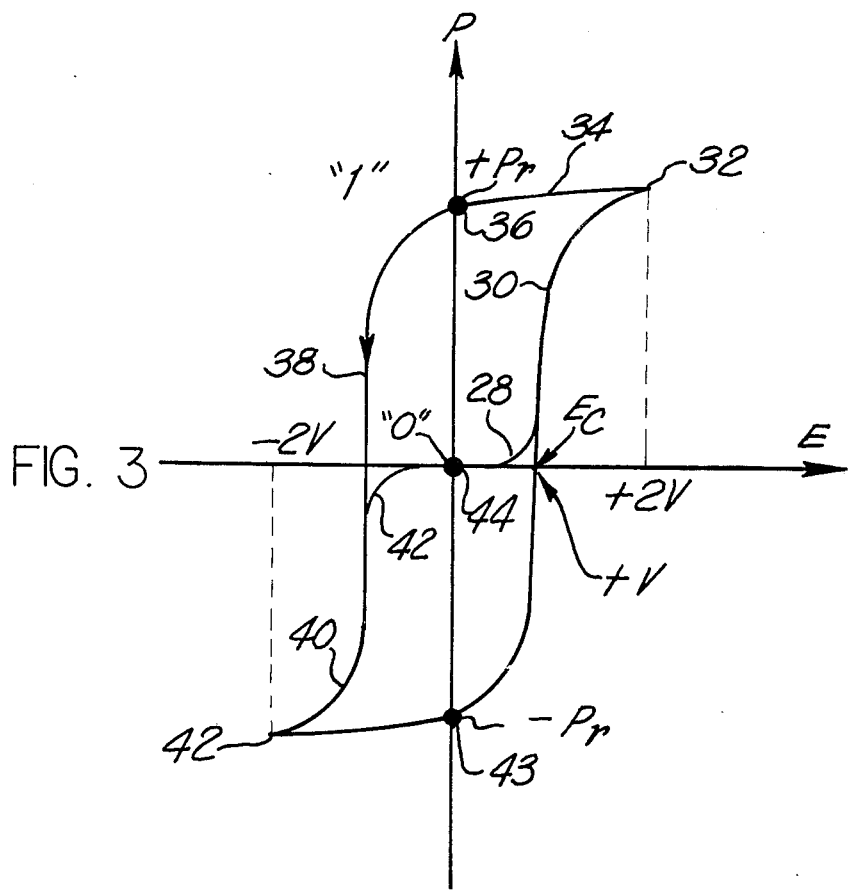
FIG. 3 is a hysteresis graph showing electric polarization of a PLZT crystal as a function of electric field strength, and illustrating polarized and depolarized memory states.

A preferred embodiment of the block data composer, generally indicated by numeral 10 of FIG. 1, is constructed on a ceramic wafer 12. The ceramic material is advantageously lead zirconate and lead titanate in a 65

:35% ratio, with a lanthanum doping of 7 atomic percent, and is referred to herein as a PLZT crystal. The PLZT material that is used in the block data composer of the preferred embodiment is obtained from the Honeywell Ceramics Center, Minneapolis, Minnesota, and is produced by a heat and pressure technique from material having a grain size of less than 2.5 micrometers. A disk of the crystal is polished to a thickness of about 150 micrometers and then temperature annealed. Transparent matrix electrodes are then formed on its major surfaces, preferably by vapor depositing CR-AU. The matrix electrodes 14 on the top side, i.e. the front, of the ceramic material 12 are depicted on FIG. 1 as parallel horizontal lines. Perpendicular electrodes 16 on the bottom, i.e. the back, of the ceramic disk 12 are represented by parallel vertical lines. For mechanical strength the PLZT crystal is thermo-compression bonded to a plexiglass substrate 18, which has conductors 20, 22, that are aligned with the transparent electrodes 14, 16 respectively to provide electrical connections to those electrodes. To relieve congestion, the electrodes 14 are connected to terminals alternately at the left and right sides of the substrate 18 of FIG. 1, and the electrodes 16 are connected alternately at the top and bottom of the figure. Individual data elements 24 of the matrix 10 are the portions of the PLZT material 12 at which a top electrode 14 is directly opposite a bottom electrode 16. Preferably, spacing areas entirely surround the individual elements 24, the spacing areas, i.e. edge areas, being portions of the PLZT having only one electrode or no electrodes.

The matrix elements are electrically polarized by applying a voltage between a selected top electrode 14 and a selected bottom electrode 16. An element at which the selected top and bottom electrodes coincide is subjected to a polarizing electric field within the PLZT material and perpendicular to the major surfaces when the voltage is applied. Voltages with respect to ground of, for example, +2V, +V, +2V, and 0, can be applied to a row electrode 14 as shown at 15a, 15b, 15c, and 15d respectively of FIG. 2a. At the same time, voltages with respect to ground of +V, 0, 0, and +2V can be applied to a column electrode 16 as shown at 15e, 15f, 15g, and 15h respectively of FIG. 2b to produce voltage differences between the row electrode 14 and the column electrode 16. In the illustrated example, the difference voltages are +V, +V, +2V, and −2V as shown at 15j, 15k, 15l, and 15m respectively of FIG. 2c.

The electric polarization remaining in a matrix element of the PLZT crystal after removal of an applied voltage depends upon the recent history of polarization of the matrix element. The electric polarization P is shown as the ordinate of the graph of FIG. 3, and the electric field intensity E is shown on the abscissa. When the electric field intensity E is progressively increased positively, starting with zero electric field E and zero polarization P, the polarization increases along a curve 28 and a curve 30 to a point 32, which represents a saturation level of polarization. If the voltage between the electrodes 14 and 16 is then reduced to 0, the polarization decreases only slightly along a line 34 to a point 36, at which the amount of polarization is a remanence level designated $+P_r$.

If a negative voltage is then applied between the electrodes 14, 16, the polarization of the corresponding element decreases along a curve 38 and a curve 40 to a negative saturation level 42. The temporary application thereafter of a positive voltage V of about half the original positive voltage brings the polarization back approximately to the starting point O.

Certain types of PLZT materials exhibit the latching or ferroelectric remanence effect just described, and it permits them to be used as memory devices as well as transducers. For example, when a remanent polarization is induced in a matrix element, a logic 1 can be said to be stored in the matrix element, for subsequent nondestructive optical readout. When a zero remanence level is established in an element of the matrix, a logic 0 can be said to be stored therein.

Figure 4:
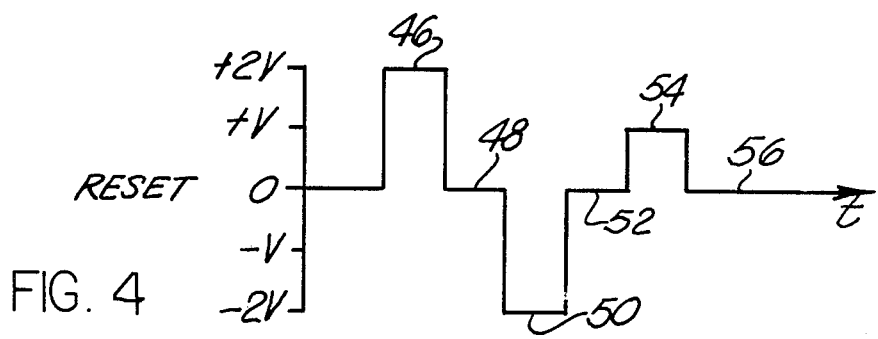
FIG. 4 is a time graph of reset voltage pulses for depolarizing elements of the block data composer.

A pulse routine for resetting or initializing the polarization remanence of all of the matrix elements of the crystal to 0 before entering data is shown in FIG. 4. First, a pulse 46 of voltage +2V is produced between a row electrode 14 and a column electrode 16 to bring the polarization to the point 32 of FIG. 3. The external voltages are then removed for an interval 48 and the polarization decreases to $+P_r$. A negative pulse 50 of voltage −2V is then applied between the electrodes 14, 16 to bring the polarization to the point 42 of FIG. 3. In a next succeeding time interval 52, the externally applied voltage difference is 0 and the polarization changes to $-P_r$ as shown at point 43 of FIG. 3. A half-select voltage difference of +V is then applied by a pulse 54. Upon termination of the pulse 54 as shown in the interval 56, the polarization falls to the 0 level shown at point 44 of FIG. 3.

Figure 5:
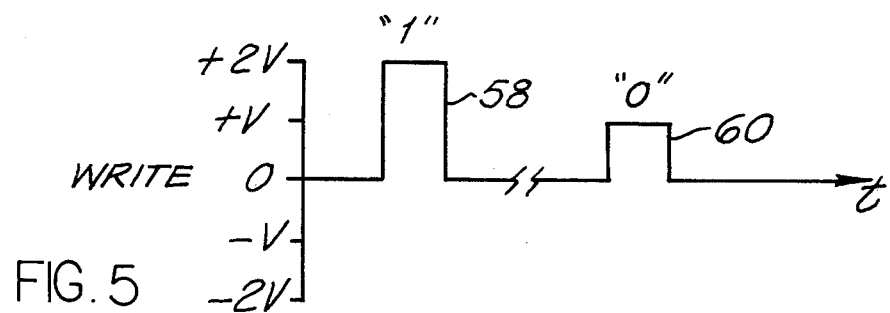
FIG. 5 is a time graph of voltage pulses for writing logic 1's and 0's into the block data composer.

FIG. 5 shows switching pulses for entering data into a matrix block data composer after a reset, by applying voltages between electrodes 14 and 16 as in FIGS. 2a, 2b, 2c. The first pulse 58 of voltage +2V represents a full select, and it writes a logic 1 into the ferroelectric element to which the voltage difference is applied. This leaves the element in a remanent polarized condition as shown at point 36 of FIG. 3, after the pulse 58 becomes zero. A smaller voltage pulse 60 has amplitude of +V, and represents a half-select or the writing of a 0 into the matrix element to which the voltage difference +V is applied. The half-select pulse is insufficient to polarize the ferroelectric element because the element's coercive force is not exceeded by a voltage of +V, and the polarization state falls back to zero after the half-select voltage pulse terminates.

Figure 6:
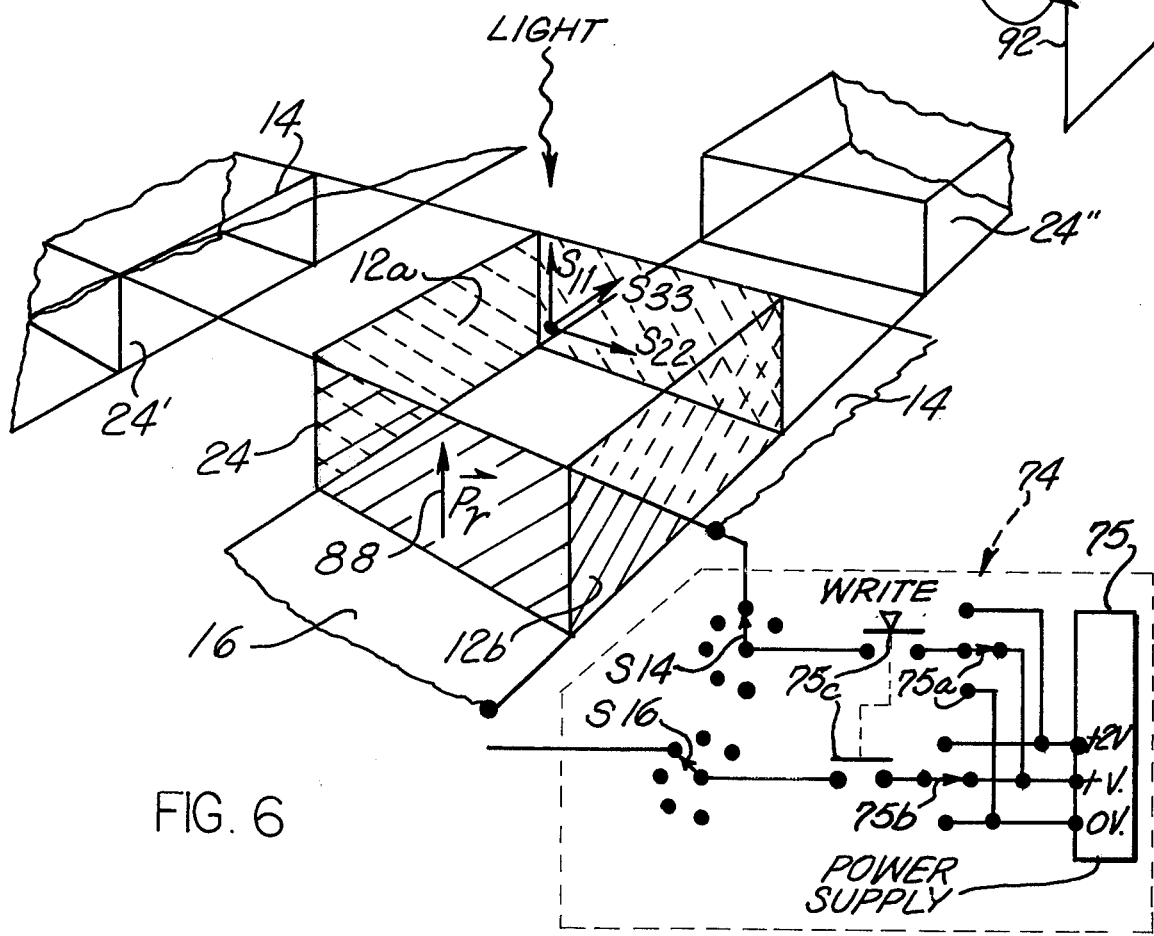
FIG. 6 is an isometric view of a few matrix elements of the PLZT block data composer showing polarization and strain components in one element.

One arrangement for applying the voltages of FIG. 2a, 2b, 2c to the electrodes 14, 16 is shown in FIG. 6. A logic circuit 74 has a power supply 75 producing potentials of 0, +V, and +2V volts, which are connected to terminals of two selector switches 75a and 75b. The armature of switch 75a connects with a selector switch S14 by which a particular one of the row electrodes 14 is selected. A particular one of the column electrodes 16 is selected by a similar switch S16, which receives voltage from the armature of the switch 75b. After the above-desired switches of circuit 74 are set, a write pushbutton switch 75c applies a voltage difference to the electrodes 14, 16. Another arrangement is to use static logic switching circuits to perform the same function, by routine design.

One design 24 of the block data composer 12, shown in FIG. 6, illustrates the directions of some of the strains that are induced therein by electrical polarization. Parts of neighboring elements 24', 24'' are also shown. One of the transparent electrodes 14 is on the top or light-input surface 12a of the block data composer another electrode 16 is on the bottom or light-output surface 12b. The side boundaries of the element 24 are imaginary surfaces within the crystal. When the matrix element 24 is remanently polarized in the direction of the vector 88, which is perpendicular to the major surfaces of the crystal 12, an expansion strain S11 is produced within the matrix element 24 in the direction of the polarization vector 88. As a result, strains are believed to be produced also in orthogonal directions S22 and S33 parallel to the electrodes 14 and 16 respectively, these being contraction strains within the element 24. Other strains may also be produced. Outside of the shaded imaginary boundaries of the matrix element 24 as shown in FIG. 6, no contraction strain sources corresponding to the strains S22 and S33 are generated. Consequently, a strain difference and therefore a strain gradient exists at the edges of the polarized matrix element 24. No such strain gradient appears at the edges of un-polarized matrix elements, of course.

The type of PLZT crystals preferably employed herein exhibits a double refraction phenomenon called birefringence, in which the crystal behaves as though it has different velocities of propagation for light waves of different polarizations. The birefringent effect in the crystal is adjustable over a wide range by electrically polarizing the crystal in the direction of the light propagation or by mechanically straining the crystal or especially by both causes acting together.

In certain PLZT materials, namely those exhibiting ferroelectric remanence, the birefringent effect can be "stored" in the crystal by subjecting the crystal to a polarizing voltage and then removing the voltage.

Because the crystal remains electrically polarized after removal of the original polarizing voltage, it also continues to exhibit the birefringent phenomenon described above after removal of the original polarizing voltage, and can serve as a memory which affects a light beam differently if it has been polarized than if it has not been polarized. A depolarized state of the crystal can arbitrarily represent a stored logic 0, while a polarized state can represent a stored logic 1, for example, so that binary data can be stored for later optical readout.

The birefringent effect in PLZT crystals due to electric polarization is relatively weak unless the crystal is also subjected to a strain-producing stress; then the birefringent effect can be very great.

When a matrix element is polarized as above, the polarizing vector, which is perpendicular to the major faces of the crystal, produces a strain vector parallel to the polarizing vector, and the polarization also causes contraction in transverse directions within the crystal between the electrodes, as described above. Because of the transverse contractions and perhaps because of other stresses, a strain gradient is established at the edges of the matrix element 24, the portion of the volume of the PLZT crystal outside of the matrix element being still in an unpolarized state. This strain gradient provides a localized strain bias at those edges which, together with the fringing electric polarization field there, causes a high level of birefringence in regions at and near those edges of the matrix element 24. Switching of a matrix element from the 0 to the 1 state therefore establishes the birefringent effect at its edges.

In a birefringent region, if linearly polarized light enters the crystal having a polarization direction such as to have one component that is affected by the first velocity of propagation and another component affected by the second velocity of propagation, the two components travel through the thickness of the crystal to the output side at different velocities. At the output side the two components may conveniently be thought of as recombining, but because one of the components has been delayed in transit more than the other, the output wave is not linearly polarized but instead is elliptically or circularly polarized. At the input surface 12a (FIG. 6) the two components are in phase with regard to time but are of course, perpendicular to each other or 90° out of phase with regard to direction. At the output surface 12b, the two components are still perpendicular to each other, that is, 90° out of phase with respect to direction, but they are no longer in phase with each other with respect to time, if they have passed through a strained and polarized, and hence, birefringent, region of the PLZT material. Thus, when the light travels near a birefringent edge of an element in which a logic 1 is stored, the linearly polarized incident wave is converted to an elliptically polarized wave. If instead, the light passes through an edge region which is not strained and polarized, as is the case near a matrix element where a logic 0 is stored, the two components at the output surface 12b are more nearly in phase with each other with respect to time, so that they can be regarded as recombining at output surface 12b to produce a linearly polarized on-going light wave whose polarization vector is un-changed as to direction.

The birefringent edge effect permits the edge areas to act as amplitude modulators of light passing through the crystal. To use this technique to read out optically the data that has been electrically stored in a matrix type of block data composer, a polarizer is placed in front of the crystal and an analyzer is placed behind it. Collimated polarized light is passed through the PLZT crystal, which elliptically polarizes the portions of the light that pass through birefringent edge regions of elements having a 1, but which leaves in a linearly polarized condition the portions of the light that pass through edge regions of elements in which a 0 is stored; the output light is then passed through an analyzer which transmits only elliptically polarized components of the light pattern, thereby detecting the data status of the element.

Figure 7:
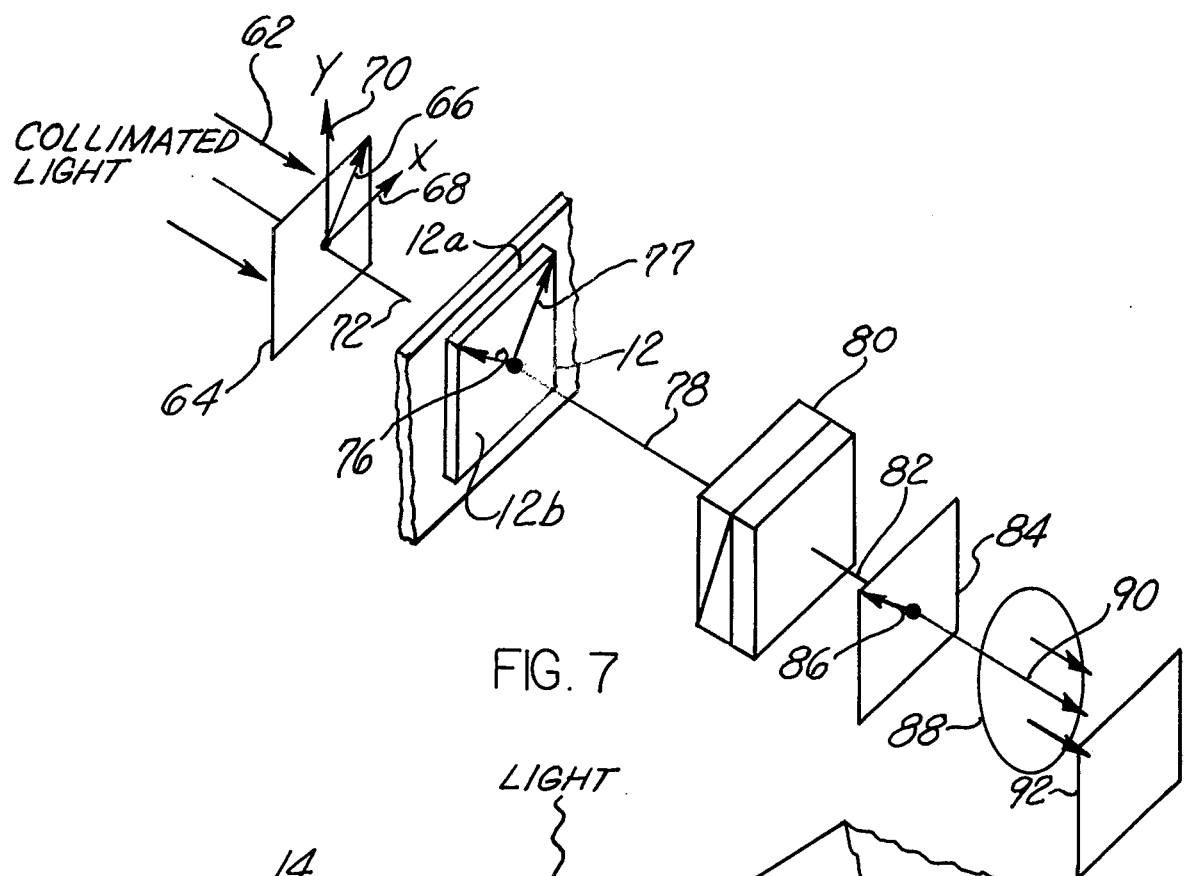
FIG. 7 shows an optical apparatus for reading data from the block data composer.

FIG. 7 shows an arrangement of apparatus for reading out data from a matrix block data composer in this way. A beam of collimated light 62 is transmitted through a polarizer 64 whose polarization vector 66 forms a 45° angle with X and Y orthogonal coordinates 68, 70 respectively, lying in the plane of the polarizer 64. Thus, the light in a region 72 of path between the polarizer 64 and the plexiglass substrate 18 is linearly polarized and has equal components in the X and Y directions.

This linearly polarized light enters the PLZT block data composer 12 at an input side 12a. For clarity the electrodes 14, 16 are not shown in FIG. 7. Certan matrix elements of the block data composer 10 contain a logic 1, and hence, are polarized to a high electrical field remanence level. The portions of the light beam which pass near any edge of an element having a 1 become elliptically polarized, because the remanent polarization has established a strain gradient at the element edges. As light passes through the crystal 12 to its light output surface 12b, the portions of light passing near the edges of an element having a 0 remain linearly polarized, just as they were in the region 72.

Because a light wave at the surface 12b from a polarized matrix element is elliptically polarized, it has a polarization vector having a component 76 at right angles to the original polarization vector 66. The elliptically polarized wave at the surface 12b can conveniently be thought of as a wave whose polarization vector is rotating during a time cycle of the wave, and whose amplitude is cyclically modulated during the rotation, so that movements of a tip of the polarization vector describe an ellipse. All four edges of an electrically polarized matrix element exhibit elliptically polarized light at the output surface 12b.

Collimated light from the output surface 12b of the PLZT crystal 12 traverses a portion 78 of the optical path to a Babinet-soleil phase retardation compensator 80 for minor adjustments, and then travels along a portion 82 of the path to a polarization analyzer 84.

A polarization vector 86 of the analyzer 84 is in an appropriate angular direction to cause the analyzer to block the components of light whose polarization is in the original polarization direction 66, 77 and to transmit the new elliptical components of light having the polarization direction 76. Because the polarization vector 86 of the analyzer 84 is crossed with respect to the polarization vector 66 of the input wave, the element light beam is blocked if no elliptical polarization has occurred in traversing the crystal, but if elliptical polarization has occurred in the crystal the analyzer transmits the new component of light that is parallel to its polarization vector.

At the output of the polarizer 84, the collimated light beam has bright lines representing the edges of those matrix elements of the block data composer 12 which were polarized to represent a logic 1, and the beam is dark at regions corresponding to the elements which were depolarized to represent a logic 0. The output light pattern can be cast onto a user device.

A cross-section of the intensity of the polarized light beam 90 at the output of the analyzer 84 is shown in FIG. 8. The pattern of FIG. 8 can be photographed by focusing the light beam 90 with a lens 88 to a photosensitive plate 92 at an image plane, FIG. 7. The plate 92 could be replaced by an array of photo-diodes or other user apparatus.

It is sometimes more convenient to observe the cross-sectional light beam pattern 90 emerging from the apparatus at a plane slightly inside or outside the image plane, to produce a blurred effect as shown in FIG. 9. This defocused mode of operation is useful for display purposes because light from the element edges is distributed over a greater area.

The contrast ratio between 1's and 0's in the optical output can be increased by dividing each electrode of one or both of the sets of electrodes 14, 16 into a plurality of electrode segments that are electrically driven in parallel. More edges are thus produced, as shown in FIG. 10. Measurements seem to indicate that, for block data composers having element sizes smaller than 100 micrometers by 100 micrometers and thicknesses greater than 200 micrometers, the width of the edge effect region depends only upon the thickness of the PLZT crystal. Consequently, when one or both of the sets of electrodes 14, 16 is divided into several narrower parallel-connected electrodes, the aggregate width of the edge effect regions is made to extend over an appreciable fraction of the element aperture, yielding a high contrast ratio and "fill factor" of the rectangles of output light.

Instead of being operated in a transmission mode as described above, the block data composer can be operated in a reflection mode in which light passes through the crystal 12 in a first direction, then is reflected and returns at least once more through the crystal, in a reverse direction.

I claim:

1. An electro-optical system for storing and reading data comprising an electro-optical birefringence device for use on a light path including a crystal having two major surfaces adapted to be disposed transversely to the light path, first and second conductive electrodes configured on portions of the first and second major surfaces respectively, a first volumetric portion of said crystal defined by the configurations of said electrodes and having electrodes on both of said surfaces, a second volumetric portion of said crystal having electrodes on fewer than both of said surfaces and forming a boundary with said first portion, and edge region of said crystal at and near said boundary, electrical energizing means connected with said electrodes for momentarilly and selectively producing a relatively high and a relatively low electric field transverse to said surfaces and principally in said first portion such that said high field causes a strain at said edge region that cooperates with said electric field to render said edge region birefringent, said crystal comprises a type of material exhibiting ferro-electric remanence, and wherein said relatively high electric field is a remanent ferro-electric field remaining in said crystal after said electrical energizing means has ceased to energize said first portion, optical means for passing light along said path and sensitive to the level of birefringence of said edge region, said optical means including light source means for directing linearly polarized light to said crystal from the same side as said first surface while said crystal is strained only at said edge region by said remanent ferro-electric field, and light analyzer means on said light path for receiving output light that has passed through said crystal, the polarization vector of said analyzer being oriented to transmit an elliptical component of polarization of said output light from said edge regions, which is produced only when said electric field is high.

2. An electro-optical system as defined in claim 1 and further comprising focusing means on said light path for focusing an image of said crystal at an image plane, and light detector means at a plane displaced along the path from said image plane for detecting a defocused image.

3. A method for storing and reading data including producing birefringence in a crystal to convert electrical signals to optical signals employing a crystal of a ferroelectric remanent type having two major surfaces disposed transversely to a light path and having first and second conductive electrodes on portions of the first and second major surfaces respectively and comprising the steps of configuring the electrodes to define a first volumetric portion of the crystal having electrodes on both of the surfaces and a second volumetric portion of the crystal having electrodes on fewer than both of the surfaces and thereby establishing a boundary between said first and second portions, temporarily electrically energizing said electrodes with signals to selectively produce one of a relatively high and a relatively low electric field transverse to said surfaces and principally in said first portion so that said high field induces in an edge region at and near said boundary a transverse strain that cooperates with said electric field to render said edge region birefringent, removing the energizing signal so that the high electric field changes to a remanence level upon said removing of said energizing signal, passing light having a polarization characteristic along the light path while said crystal is strained only at said edge region by virtue of the remanent field, the polarization characteristic of said light after emergence from said crystal being responsive to the level of birefringence of said edge region and thereby differently responsive to a said strained edge region than to a non-strained region.

4. A method as set forth in claim 3 including the further step of focusing light passed through said crystal for focusing an image thereof at an image plane, and detecting said passed light at a plane displaced from said image plane so as to detect a defocused image.

* * * * *